(12) United States Patent
Kemppinen et al.

(10) Patent No.: US 10,141,496 B2
(45) Date of Patent: Nov. 27, 2018

(54) DEVICE HOUSING WITH VIBRATOR COMPONENT

(71) Applicant: Microsoft Technology Licensing, LLC, Redmond, WA (US)

(72) Inventors: Pasi Kemppinen, Tampere (FI); Antti Kangasaho, Tampere (FI)

(73) Assignee: Microsoft Technology Licensing, LLC, Redmond, WA (US)

( * ) Notice: Subject to any disclaimer, the term of this patent is extended or adjusted under 35 U.S.C. 154(b) by 242 days.

(21) Appl. No.: 15/225,096

(22) Filed: Aug. 1, 2016

(65) Prior Publication Data
US 2018/0033946 A1 Feb. 1, 2018

(51) Int. Cl.
| | | |
|---|---|---|
| *H01L 41/04* | (2006.01) | |
| *H01L 41/053* | (2006.01) | |
| *H01L 41/09* | (2006.01) | |
| *G06F 3/01* | (2006.01) | |

(52) U.S. Cl.
CPC ............ *H01L 41/053* (2013.01); *G06F 3/016* (2013.01); *H01L 41/042* (2013.01); *H01L 41/0933* (2013.01)

(58) Field of Classification Search
CPC .. H01L 41/053; H01L 41/0933; H01L 41/052
USPC ......................................... 310/328, 330–332
See application file for complete search history.

(56) References Cited

U.S. PATENT DOCUMENTS

| | | |
|---|---|---|
| 8,378,979 B2 | 2/2013 | Frid et al. |
| 8,680,746 B2 | 3/2014 | Takahashi et al. |
| 2008/0122315 A1* | 5/2008 | Maruyama ............... G06F 3/016 310/314 |
| 2012/0104901 A1 | 5/2012 | Jiang et al. |
| 2012/0248935 A1* | 10/2012 | Liu ........................ G06F 3/016 310/326 |
| 2013/0287242 A1 | 10/2013 | Nabata et al. |
| 2013/0314355 A1 | 11/2013 | Inata et al. |
| 2014/0036431 A1 | 2/2014 | Sasaki et al. |

(Continued)

FOREIGN PATENT DOCUMENTS

| | | |
|---|---|---|
| KR | 20130053379 | 5/2013 |
| KR | 20140103878 | 8/2014 |
| KR | 20150101967 | 9/2015 |

OTHER PUBLICATIONS

"International Search Report and Written Opinion Issued in PCT Application No. PCT/US2017/043569", dated Oct. 10, 2017, 11 Pages.

(Continued)

*Primary Examiner* — Derek Rosenau
(74) *Attorney, Agent, or Firm* — Klarquist Sparkman, LLP (57) ABSTRACT

Technologies are described for a piezo electric element for generating vibrations in an electronic device. The piezo electric element comprises a piezo beam and an elongate mass. The piezo beam is sized for positioning in an internal recess of the electronic device and configured for mounting to an internal structure of the electronic device adjacent the recess in a mounting direction generally perpendicular to a thinnest dimension of the electronic device. The elongate mass is coupled to a center area of the piezo beam and having opposing free ends that are free to vibrate in a selected frequency range. An electronic device having a piezo electric element is also described.

15 Claims, 7 Drawing Sheets

(56) References Cited

U.S. PATENT DOCUMENTS

2014/0247227 A1 9/2014 Jiang et al.
2014/0346924 A1* 11/2014 Son ..................... B06B 1/0603
          310/317
2015/0318462 A1 11/2015 Kim

OTHER PUBLICATIONS

"Advantages of Piezoelectric Actuators in Haptic Feedback Applications," Published on: Jul. 29, 2013, Available at: https://www.youtube.com/watch?v=IS2hMw8euOI.
B.K., Han, "HMC Piezo Actuator," Retrieved on: Mar. 21, 2016, Available at: https://www.youtube.com/watch?v=gcUcagdqmJc.
Rao, Shreharsha, "High-definition haptics: Feel the difference!," In Analog Applications Journal, Jul. 17, 2012, 6 pages.

* cited by examiner

DEVICE HOUSING WITH VIBRATOR COMPONENT

BACKGROUND

Providing haptic communication or feedback to a user of an electronic device increases the user's experience, at least in part because the haptic stimuli (e.g., vibrations) are perceived differently and offer variety in today's visually overstimulated environment.

Electronic devices, including mobile devices, are becoming smaller, particularly in their depth or thickness dimension. As a result, housings are smaller and there is less available internal space, particularly in mobile phones and other similar devices, in which to house a vibrator component or other similar device to produce vibrations. At the same time, there is demand to produce vibrations in selected patterns faster and with greater force to enhance the haptic experience.

Therefore, there exists ample opportunity to improve in technologies relating to vibrator components used in electronic and mobile devices.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Technologies are described for using a vibrator component, e.g., a piezo electric element, for generating vibrations in an electronic device. The piezo electric element includes a piezo beam and an elongate mass. The piezo beam is sized for positioning in an internal recess of the electronic device, such as within its housing. The piezo beam is configured for mounting to an internal structure of the electronic device that is adjacent the recess. The mounting is achieved in a mounting direction generally perpendicular to a thinnest dimension of the electronic device (i.e., the mounting direction is typically towards a side of the device). The elongate mass is coupled to a center area of the piezo beam and has opposing free ends that are free to vibrate in a selected frequency range. Because the piezo beam is mounted to the internal structure directly, additional space-consuming structure (such as a piezo element cover) can be eliminated, and the device can be positioned more precisely and/or securely.

In alternative implementations, the piezo beam is fastened to the internal structure with fasteners and/or adhesive.

In an alternative implementation, the piezo element is positioned parallel to at least one side that defines the thinnest dimension of the device. In an alternative implementation, the piezo element is positioned parallel to a longer side of the device.

In an alternative implementation, the piezo element is positioned to produce vibrations primarily in an XY plane defined to extend through sides of the device that comprise its thinnest dimension.

An electronic device having a piezo element is also described.

As described herein, a variety of other features and advantages can be incorporated into the technologies as desired.

DETAILED DESCRIPTION

As described herein, various technologies can be applied to vibrator components. It is desirable to have a vibrator component that is controllable to yield a desired haptic response at a high level yet can still be accommodated in a smaller electronic device.

Figure 1:
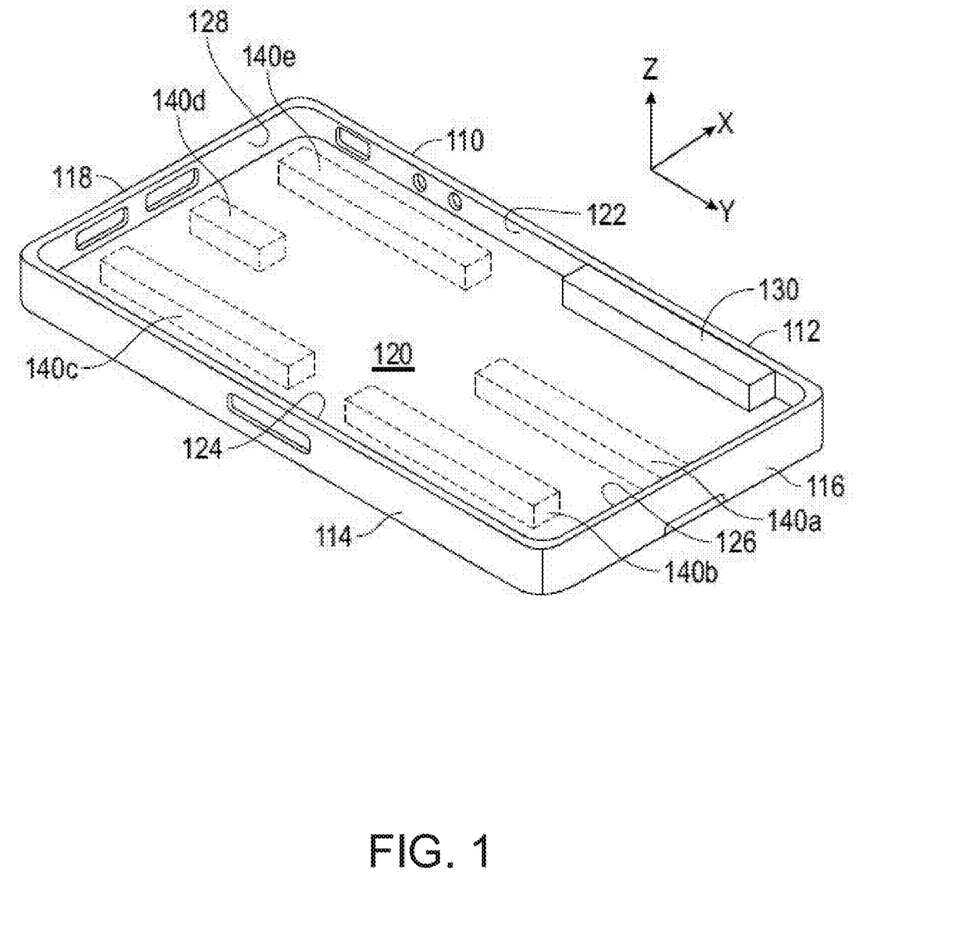
FIG. 1 is a schematic perspective view of a portion of an electronic or mobile device showing an internal space within its housing and a vibration component in several possible locations and configurations within the internal space.

FIG. 1 is a perspective view of a representative electronic or mobile device, e.g., a mobile phone, showing a portion of a housing 110 and an open interior space. The front portion of the device, which typically includes a display, has been removed. A vibrator component, e.g., a piezo electric element, is shown schematically as a rectangular prism in a first position at 130, and in several alternative positions and configurations 140a-140e as described below. (Other components of the mobile device, which would typically fill the open interior space, have been omitted for clarity.)

The mobile device housing 110 has a first pair of opposite sides 112, 114 (i.e., a pair of "longer" sides) and a second pair of sides 116, 118 (i.e., a pair of shorter sides) that connect the sides 112, 114. There is an interior rear surface 120 that extends between the sides 112, 114 and 116, 118. Conventionally, the sides for a generally rectangular device such as is shown in FIG. 1 are described as extending in the X direction and in the Y direction, respectively. The major surfaces of the device (typically the front and the rear) are described as extending in the X and Y directions (and may be planar as shown). Thus, the thinnest dimension of the device, sometimes referred to as its depth, extends along the Z axis. Some of today's full-featured mobile devices are being designed to have a depth or Z axis dimension as thin as approximately 4 mm.

As shown at the right side of FIG. 1, the side 112 has an interior side surface 122. Similarly, the side 114 has an interior side surface 124, although it is not fully visible in FIG. 1 due to the angle of the perspective. The side 116 has an interior side surface 126, although it also is not fully visible for the same reason. The side 118 has an interior side surface 128.

The piezo electric element 130, shown schematically and in solid lines, is positioned adjacent the side 112, and, in the illustrated implementation, is in contact with the side 112 and its interior side surface 122. Such a location for the piezo electric element 130 has several benefits. Positioning the piezo electric element 130 near a side (sometimes also referred to as an "edge") of the device, such as the side 112, allows the vibrations that are generated to pass through to the user's hand relatively directly without as much energy being lost to other structure absorbing them. Thus, power consumption can be reduced. In some implementations, as described in more detail below, the piezo electric element 130 can be mounted directly to a side, such as to the inner surface 122 of the side 112. In other implementations, the piezo electric element 130 can be mounted to the interior rear surface 120, or to an internal structural component, which like the sides, extends in the Z direction. It is very often easier to accommodate components having a substantial size, such as the piezo electric element 130, along sides of the device because the more central areas must be reserved for its largest components, which are typically a battery and a printed circuit board.

In other implementations, the piezo electric element or elements may be located at other positions within the housing. For the sake of illustration, and as examples only, various representative positions are shown at 140a-140e. Position 140a is more central but is close to the side 116. Positions 140b and 140c are slightly spaced from the left side of the device, i.e., the side 114. Position 140d is more central, and also shows a smaller volume piezo electric element, which may be suitable in certain implementations. Position 140e is on the right side of the device, but is slightly spaced from the side 112.

In some implementations, the housing 110 or portions thereof are made of metal. In other implementations, the housing 110 is made of a plastic or other suitable materials. In any event, the vibrations generated by the piezo electric element 130 can be calibrated to account for differences in positioning, surrounding material and other factors in seeking to achieve a desired haptic effect. Although the description herein generally refers to a "housing" for convenience, it encompasses case, casing, shell, cover and other similar terms.

Figure 2:
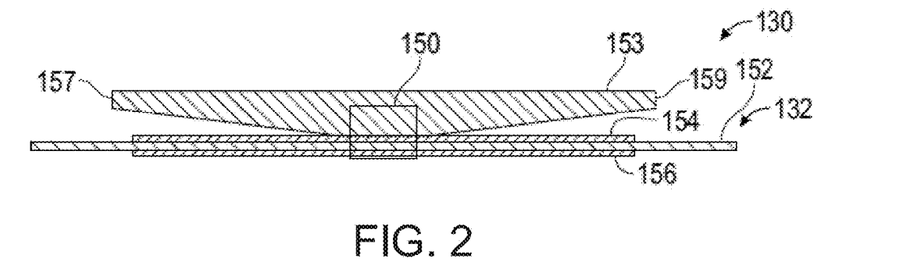
FIG. 2 is a schematic side elevation view of a piezo electric vibration element.

A representative vibrator component, in the form of a piezo electric element 130, is shown in FIG. 2. The piezo electric element 130 has a piezo beam 132 to which a mass 153 is coupled. The piezo beam 132 has a conductive element 152, and there are ceramic layers 154 and 156 attached to each of the two sides of the conductive element 152. When differential voltage is applied across the piezo electric element 130, it bends or deforms, thereby generating vibrations. Such a piezo electric element can be calibrated so its vibrations are primarily felt but not heard.

In the implementation of FIG. 2, the mass 153 is coupled to the piezo beam 132 at a generally central location. The mass 153 has an elongate shape with a body that tapers towards its opposite free ends 157, 159. The free ends 157, 159 are spaced away from the respective ends of the piezo beam 132. In some implementations, such as is shown in FIG. 2, the conductive element 152 can be formed with a side flange 150 (or a pair of flanges), shown transparently in FIG. 2, by which the mass 153 is coupled to the beam 132.

Figure 3:
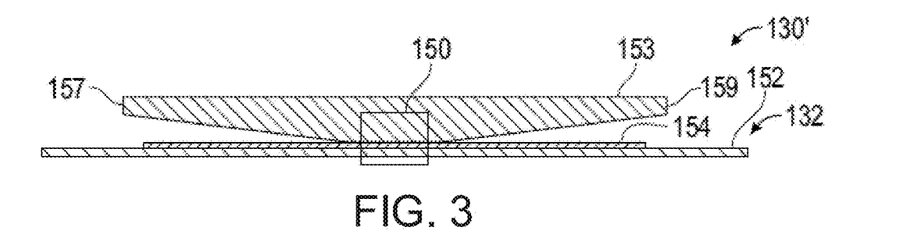
FIG. 3 is a schematic side elevation view of an alternative piezo electric element having a single ceramic layer on the piezo beam.

FIG. 3 is a schematic drawing of an alternative piezo electric element 130' that is similar to the piezo electric element 130, but has only a single ceramic layer 154 (which can be on either side of the conductive element 152.

Figure 4:
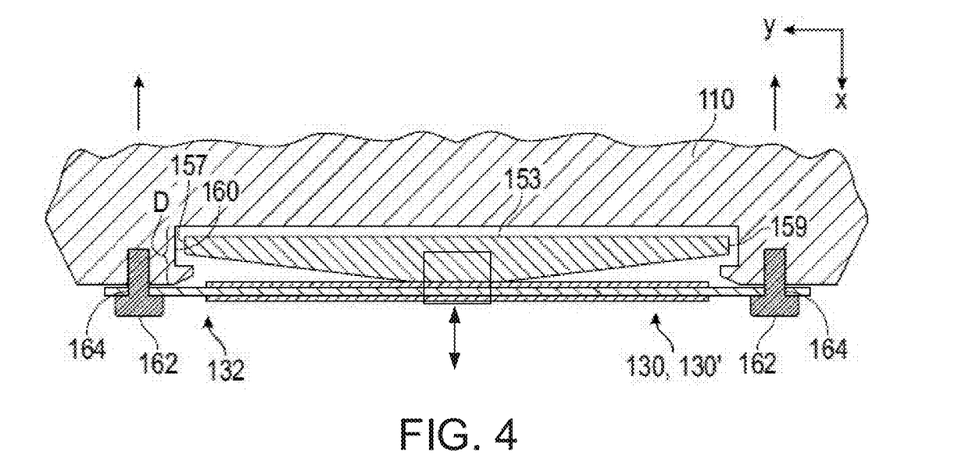
FIG. 4 is a schematic top plan view of a portion of a housing with the piezo electric element mounted to internal structure within the housing.

FIG. 4 is a schematic plan view of a portion of the device housing 110 showing the piezo electric element 130 (or 130') mounted to the device in a recess 160. Although illustrated as a single-piece construction, the recess 160 could of course be defined by a multi-piece construction of joined housing elements. Further, it is possible that all or a portion of the surfaces appearing as walls defining the recess may have other functions and/or be surfaces or other components. As shown, the recess is specially shaped to accommodate the piezo electric element 130, 130', and particularly its length. The recess 160 has a depth D in the direction that the mass 153 moves that is sized to prevent contact between the mass 153 and the recess 160 while the piezo electric element 130, 130' is vibrating, and particularly over the selected operating range. At the same time, the size of the recess is made as small as possible to conserve its required space. This also contributes to keeping the piezo beam from bending too much, which prevents it from cracking.

In the illustrated implementation, the piezo electric element 130, 130' is mounted to internal structure, e.g., an internal structural component (or components) of the device, in a mounting direction that extends as shown by the arrows parallel to the movement axis of the mass 153. In the illustrated implementation, the mounting direction extends in the X direction. In other implementations, the mounting direction extends in the Y direction. Thus, for implementations in which the mounting direction extends in the X and/or Y directions, the mounting direction can be described as extending approximately perpendicular to the thinnest dimension (i.e., perpendicular to the Z direction) of the device.

In the illustrated implementation, there is at least one screw 162 (or other fastener) extending in the mounting direction to mount the piezo electric element 130, 130' to the internal structural component. In the illustrated implementation, there is an opening 164 defined at each of the opposite ends of the piezo beam 132 and sized to receive the fastener 162. Given that the piezo electric element 130, 130' generates vibrations, its mounting should be robust so that it remains intact over the life of the device and in the event that the device is dropped, etc. In some implementations, thread locking compound can be used on the threads of the fasteners 162 such that they resist loosening. In some implementations, it is possible to use an adhesive to secure the piezo electric element 130, 130' in place, either in place of or in addition to threaded fasteners. Further, the materials used near the mounting locations can be selected to reduce harmonic frequencies (i.e., sounds that can be heard). As one example, each mounting location can include one or more washers made of a sound absorbing material and positioned on side(s) of the piezo beam 132 to help reduce unwanted sounds.

In the illustrated implementation, the piezo electric element 130, 130' is mounted directly, such as via the piezo beam 132. The piezo electric element need not be fitted with any cover or other intervening structure between the piezo beam 132, mass 153 and the recess 160. Rather, the piezo electric element is implemented in a bare condition.

Figure 5:
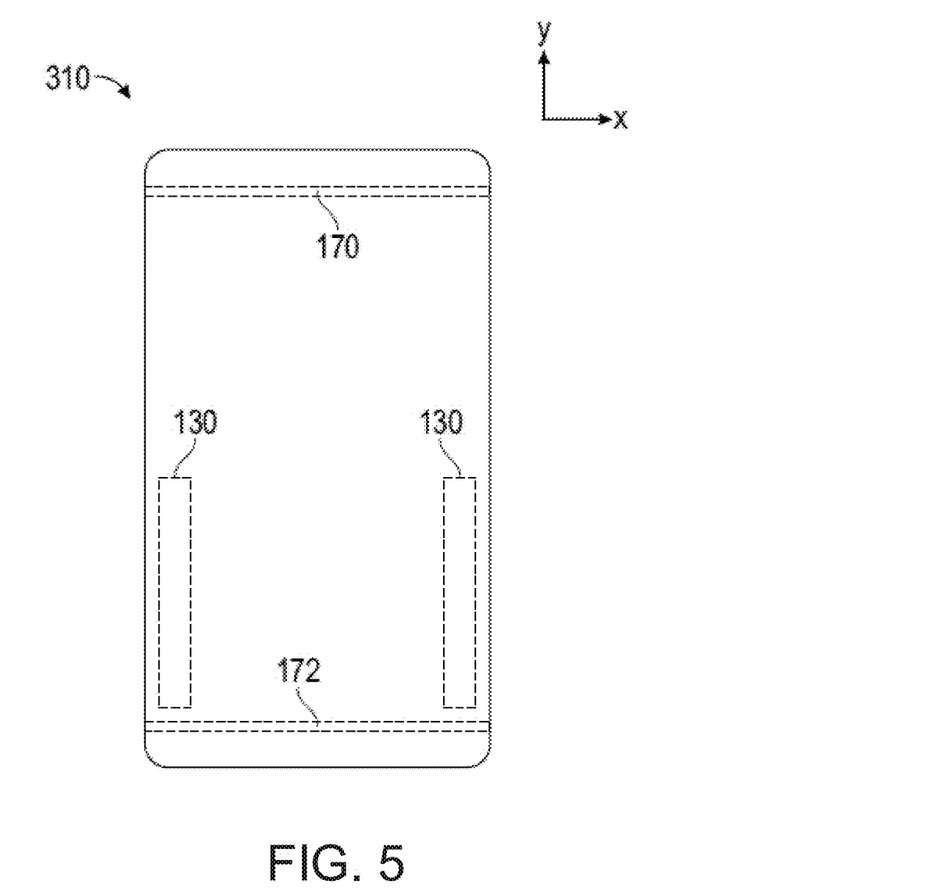
FIG. 5 is a schematic top plan view of a mobile device showing selected locations of the piezo electric element in a mobile device having antenna areas.

FIG. 5 is a schematic front elevation view of a housing 310 in which antenna areas 170, 172 have been shown. The antenna areas 170, 172 are representative areas in the housing in which antennas are positioned. The housing 310 can be made partially or completely of metal. The piezo electric element can be positioned adjacent one of the longer sides as shown, which yields good overall performance in a device sized for using in a single and/or with two hands. To avoid interference or degradation in performance of antennas, the piezo electric element 130 can be positioned as shown to be spaced apart from the antenna area 170, or, if two antenna areas are present, spaced apart from and between the antenna areas 170, 172. FIG. 5 also indicates a preferred location for implementations with one piezo electric element 130, i.e., it is positioned adjacent one edge of the device, such as adjacent a longer edge as shown.

Figure 6:
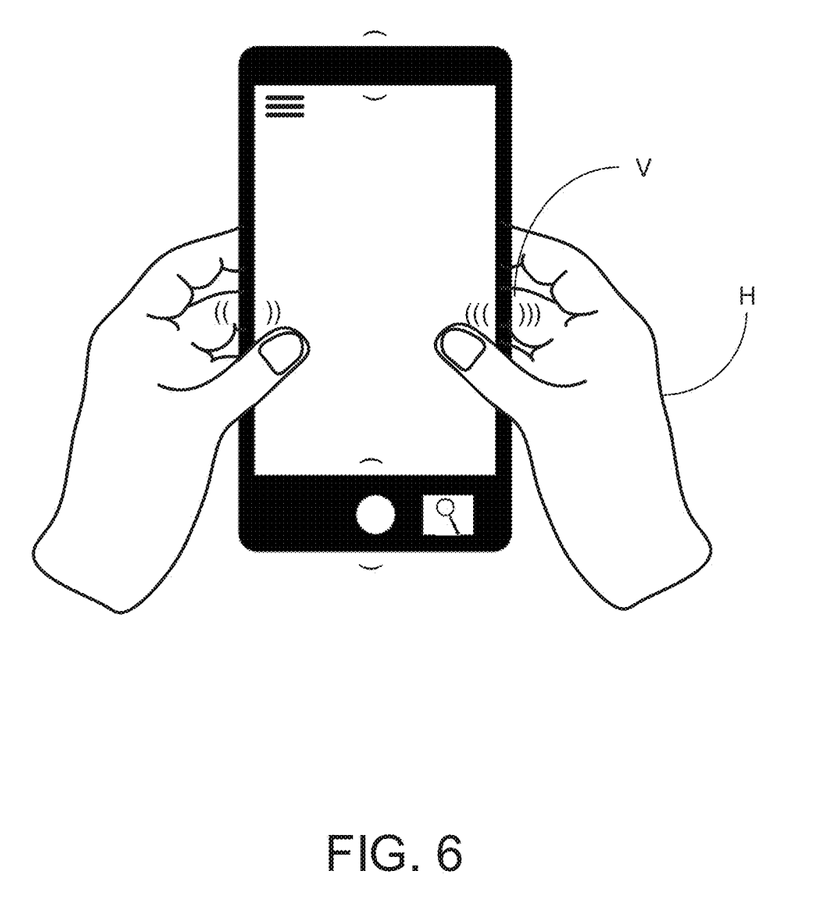
FIG. 6 is a schematic view of a mobile device being held by a user while a haptic output is being generated primarily thorough the thinnest dimension of the device (including its longer sides).

FIG. 6 is a schematic diagram of an electronic device having a piezo electric element within in its housing adjacent the right side of the device. As shown, the device is being held in the user's hands H, primarily along the longer sides of the device, and the vibrations V produced by the piezo electric element are perceived to be strongest in the user's right hand. Vibrations are also sensed in the user's left hand (for a device with a metal cover, the vibrations will be sensed to have about the same strength by either hand). There may be residual vibrations in other directions, such as along the shorter sides of the device as shown. Approximately the same stimulus is felt if the user is holding the device in one hand, i.e., the vibrations are stronger on the right side of the device. In some implementations, the piezo electric element is controlled to produce different vibrations according to its current orientation, e.g., if it is rotated from its portrait orientation as shown in FIG. 6 to its landscape orientation.

Figure 7:
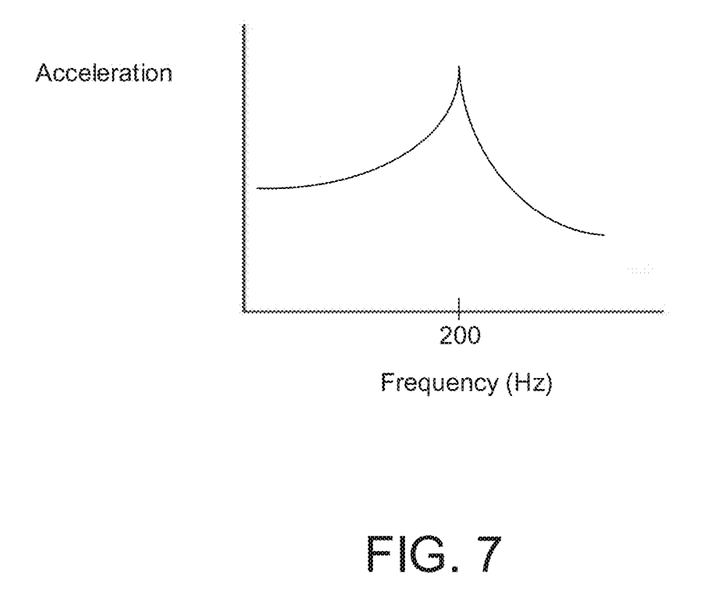
FIG. 7 is a schematic graph of acceleration versus frequency for the piezo electric element showing a sharp response at approximately 200 Hz.

FIG. 7 is a graph of acceleration versus frequency showing that the piezo electric element can be configured to provide a relatively sharp response at a desired frequency range, e.g., approximately 200 Hz. In some implementations, the piezo electric element is designed to produce a root means square acceleration ($G_{rms}$) of up to approximately 1.0 (as measured using a 100 g reference mass in a jig) while keeping power consumption reasonable, or in some cases even 2.0 $G_{rms}$.

Figure 8:
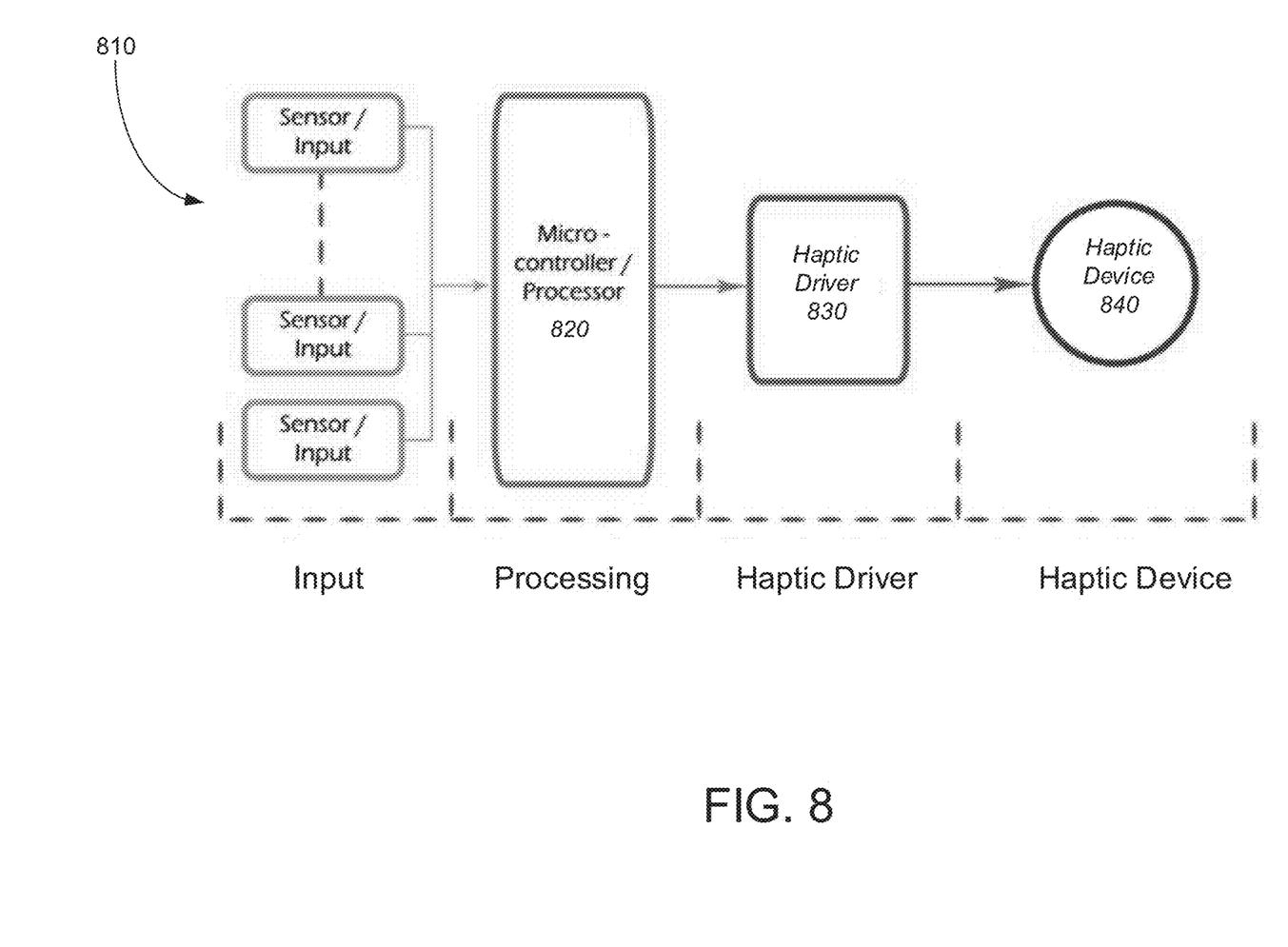
FIG. 8 is a schematic block diagram showing major components of the electronic device having the piezo electric element or similar haptic device and logical relationships between these components.

FIG. 8 is a diagram showing the logical and functional relationships between the piezo electric element, as one form of a haptic device 840, and other components of the electronic device, in generating a haptic feedback signal. At the left side of the figure, one or more sensor inputs 810 or other inputs can be configured to trigger a haptic response. As just a few examples, the inputs could include alerts when communications (calls, texts, emails, etc.) are received by the device, alerts at specified times (timers, reminders, etc.), alerts based on a location or position of the device, or any other parameters as desired. In most cases, the processing of the input takes place at least in part with the device's microprocessor 820. In typical implementations, there is a driver, such as a haptic driver 830, that receives instructions from the microprocessor 820 and is connected to the haptic device 840, to drive it according to selected parameters (such as frequency and duration, among others).

Figure 9:
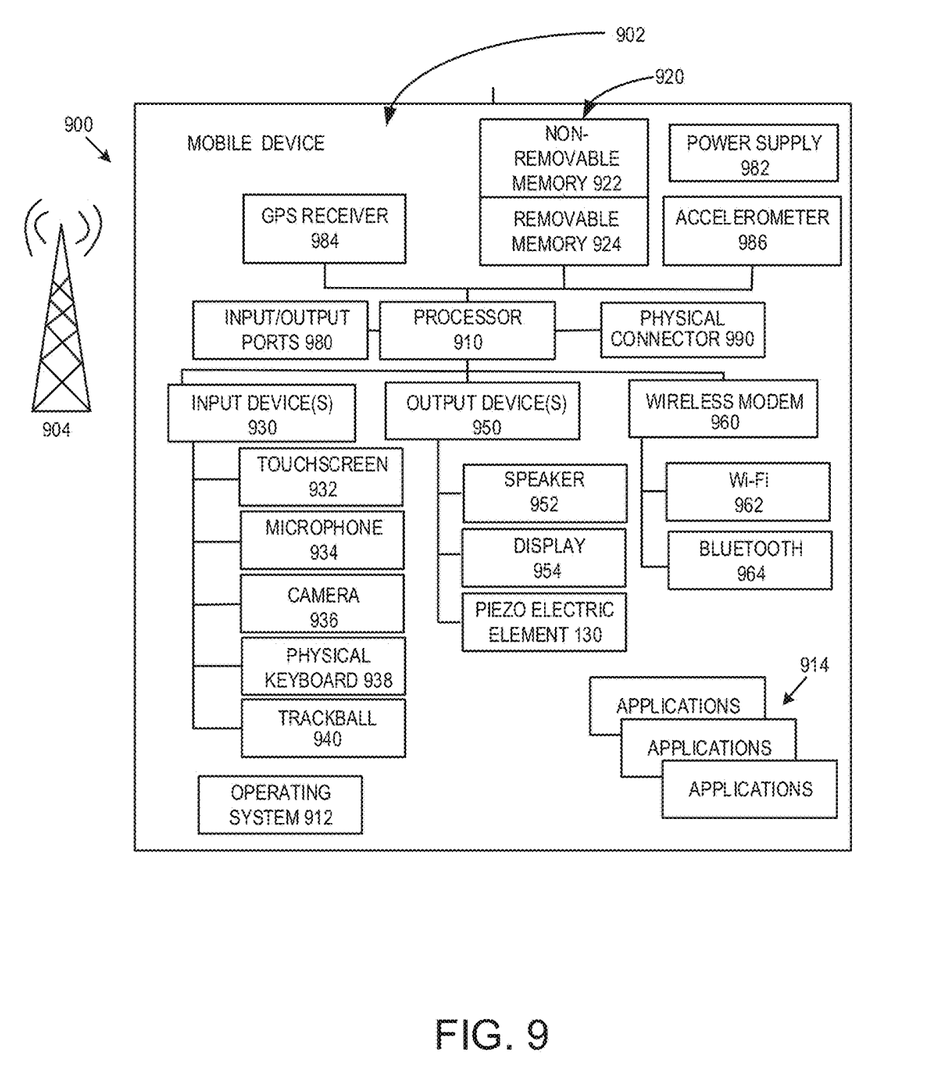
FIG. 9 is a schematic diagram of an electronic or mobile device that can be used in conjunction with the technologies described herein.

FIG. 9 is a system diagram depicting a representative electronic or mobile device 900 according to any of the above implementations, including a variety of optional hardware and software components, shown generally at 902. Any components 902 in the mobile device can communicate with any other component, although not all connections are shown, for ease of illustration. The mobile device can be any of a variety of computing devices (e.g., mobile phone, smartphone, tablet, handheld computer, Personal Digital Assistant (PDA), laptop computer, game controller, etc.) and can allow wireless two-way communications with one or more mobile communications networks 904, such as a cellular, satellite, or other network.

The illustrated mobile device 900 can include a controller or processor 910 (e.g., signal processor, microprocessor, ASIC, or other control and processing logic circuitry) for performing such tasks as signal coding, data processing, input/output processing, power control, and/or other functions. An operating system 912 can control the allocation and usage of the components 902 and support for one or more application programs 914. The application programs can include common mobile computing applications (e.g., email applications, calendars, contact managers, web browsers, messaging applications), or any other computing application. Functionality for accessing an application store can also be used for acquiring and updating application programs 914.

The illustrated mobile device 900 can include memory 920. Memory 920 can include non-removable memory 922 and/or removable memory 924. The non-removable memory 922 can include RAM, ROM, flash memory, a hard disk, or other well-known memory storage technologies. The removable memory 924 can include flash memory or a Subscriber Identity Module (SIM) card, which is well known in GSM communication systems, or other well-known memory storage technologies, such as "smart cards." The memory 920 can be used for storing data and/or code for running the operating system 912 and the applications 914. Example data can include web pages, text, images, sound files, video data, or other data sets to be sent to and/or received from one or more network servers or other devices via one or more wired or wireless networks. The memory 920 can be used to store a subscriber identifier, such as an International Mobile Subscriber Identity (IMSI), and an equipment identifier, such as an International Mobile Equipment Identifier (IMEI). Such identifiers can be transmitted to a network server to identify users and equipment.

The mobile device 900 can support one or more input devices 930, such as a touchscreen 932, microphone 934, camera 936, physical keyboard 938 and/or trackball 940 and one or more output devices 950, such as a speaker 952 and a display 954. Other possible output devices can include the piezo electric element 130 (or other type of haptic device). Some devices can serve more than one input/output function. For example, touchscreen 932 and display 954 can be combined in a single input/output device.

The input devices 930 can include a Natural User Interface (NUI). An NUI is any interface technology that enables a user to interact with a device in a "natural" manner, free from artificial constraints imposed by input devices such as mice, keyboards, remote controls, and the like. Examples of NUI methods include those relying on speech recognition, touch and stylus recognition, gesture recognition both on screen and adjacent to the screen, air gestures, head and eye tracking, voice and speech, vision, touch, gestures, and machine intelligence. Other examples of a NUI include motion gesture detection using accelerometers/gyroscopes, facial recognition, 3D displays, head, eye, and gaze tracking, immersive augmented reality and virtual reality systems, all of which provide a more natural interface, as well as technologies for sensing brain activity using electric field sensing electrodes (EEG and related methods). Thus, in one specific example, the operating system 912 or applications 914 can comprise speech-recognition software as part of a voice user interface that allows a user to operate the device 900 via voice commands. Further, the device 900 can comprise input devices and software that allows for user interaction via a user's spatial gestures, such as detecting and interpreting gestures to provide input to a gaming application.

A wireless modem 960 can be coupled to an antenna (not shown) and can support two-way communications between the processor 910 and external devices, as is well understood in the art. The modem 960 is shown generically and can include a cellular modem for communicating with the mobile communication network 904 and/or other radio-based modems (e.g., Bluetooth 964 or Wi-Fi 962). The wireless modem 960 is typically configured for communication with one or more cellular networks, such as a GSM network for data and voice communications within a single cellular network, between cellular networks, or between the mobile device and a public switched telephone network (PSTN).

The mobile device can further include at least one input/output port 980, a power supply 982, a satellite navigation system receiver 984, such as a Global Positioning System (GPS) receiver, an accelerometer 986, and/or a physical connector 990, which can be a USB port, IEEE 1394 (FireWire) port, and/or RS-232 port. The illustrated components 902 are not required or all-inclusive, as any components can be deleted and other components can be added.

The following paragraphs further describe implementations of the piezo element and an associated electronic device:

A. A piezo electric element for generating vibrations in an electronic device, comprising:
a piezo beam sized for positioning in an internal recess of the electronic device and configured for mounting to an internal structure of the electronic device adjacent the recess in a mounting direction generally perpendicular to a thinnest dimension of the electronic device;
an elongate mass coupled to a center area of the piezo beam and having opposing free ends that are free to vibrate in a selected frequency range.

B. The piezo electric element of paragraph A, wherein the piezo beam has opposite first and second ends spaced apart from ends of the elongate mass and having respective first and second openings, and wherein the first and second openings are dimensioned to receive a fastener inserted parallel to the mounting direction.

C. The piezo electric element of any one of paragraphs A-B, wherein the piezo beam has opposite first and second ends spaced apart from ends of the elongate mass and configured for mounting to the internal structure in the mounting direction with adhesive.

D. The piezo electric element of any one of paragraphs A-C, wherein the piezo beam and the elongate mass are positionable to extend approximately parallel to at least one side of the electronic device that defines the thinnest dimension.

E. The piezo electric element of any one of paragraphs A-D, wherein the piezo beam and the elongate mass are positionable to extend approximately parallel to a longer side of the electronic device.

F. The piezo electric element of any one of paragraphs A-E, wherein the piezo beam and the elongate mass are configured for use as a bare component within the recess of the electronic device.

G. The piezo electric element of any one of paragraphs A-F, wherein the piezo beam is configured to translate primarily in a direction parallel to the mounting direction, thereby causing the elongate mass to produce vibrations primarily in a X-Y plane defined to extend through sides of the electronic device that comprise the thinnest dimension.

H. The piezo electric element of any one of paragraphs A-G, wherein the elongate mass is joined to the piezo beam by a side flange extending from the piezo beam.

I. The piezo electric element of any one of paragraphs A-H, wherein the piezo beam comprises a center metal member between outer ceramic members.

M. The piezo electric element of any one of paragraphs A-H, wherein the piezo beam comprises a metal member and a single ceramic member attached to one side of the metal member.

N. An electronic device, comprising:
a housing in which an internal recess is defined;
a piezo beam positioned in the internal recess and mounted to an internal structure of the electronic device defining a wall of the recess, the piezo beam being mounted to the internal structure in a mounting direction generally perpendicular to a thinnest dimension of the electronic device; and
an elongate mass coupled to a center area of the piezo beam and having opposing free ends that are free to vibrate at selected frequencies to produce haptic feedback.

O. The electronic device of paragraph N, wherein the piezo beam has opposite ends mounted with fasteners inserted parallel to the mounting direction into the wall of the recess.

P. The electronic device of any of paragraphs N-O, wherein the piezo beam and elongate mass are positioned approximately parallel to a longer side of the electronic device.

Q. The electronic device of any of paragraphs N-P, wherein the piezo beam and elongate mass are positioned adjacent a side of the electronic device.

R. The electronic device of any of paragraphs N-Q, wherein the internal recess is sized to accommodate the piezo beam and the elongate mass in a bare condition.

S. The electronic device of any of paragraphs N-R, wherein the housing comprises at least one antenna region for accommodating an antenna of the electronic device, and wherein the piezo beam and elongate mass are spaced apart from the antenna region.

T. The electronic device of any of paragraphs N-S, wherein the housing comprises a first antenna region for accommodating a first antenna of the electronic device and a second antenna region for accommodating a second antenna, and wherein the antenna regions extend generally parallel to a shorter side of the device, and wherein the piezo beam and the elongate mass are positioned between and spaced apart from the antenna regions.

U. The electronic device of any of paragraphs N-T, wherein the piezo beam is electrically linked to a driver controllable to drive the piezo beam to vibrate at the selected frequencies.

V. The electronic device of any of paragraphs N-U, further comprising at least one microprocessor controllably linked to the driver.

W. The electronic device of any of paragraphs N-W, further comprising a filter configured to filter out undesired vibrations outside of the selected frequency range.

In view of the many possible embodiments to which the disclosed principles may be applied, it should be recognized that the illustrated embodiments are only preferred examples and should not be taken as limiting in scope. Rather, the scope is defined by the following claims. We therefore claim all that comes within the scope and spirit of these claims.

We claim:

1. An electronic device, comprising:
a housing in which an internal recess is defined, wherein the housing comprises a first antenna region for accommodating a first antenna of the electronic device and a second antenna region for accommodating a second antenna of the electronic device, wherein the first and second antenna regions extend generally parallel to a shorter side of the device;

a piezo beam positioned in the internal recess and mounted to an internal structure of the electronic device defining a wall of the recess, the piezo beam being mounted to the internal structure in a mounting direction generally perpendicular to a thinnest dimension of the electronic device; and an elongate mass coupled to a center area of the piezo beam and having opposing free ends that are free to vibrate at selected frequencies to produce haptic feedback, wherein the piezo beam and the elongate mass are positioned between and spaced apart from the first and second antenna regions.

2. The electronic device of claim 1, wherein the piezo beam has opposite first and second ends spaced apart from ends of the elongate mass and having respective first and second openings, and wherein the first and second openings are dimensioned to receive a fastener inserted parallel to the mounting direction.

3. The electronic device of claim 1, wherein the piezo beam has opposite first and second ends spaced apart from ends of the elongate mass and configured for mounting to the internal structure in the mounting direction with adhesive.

4. The electronic device of claim 1, wherein the piezo beam is configured to translate primarily in a direction parallel to the mounting direction, thereby causing the elongate mass to produce vibrations primarily in a X-Y plane defined to extend through sides of the electronic device that comprise the thinnest dimension.

5. The electronic device of claim 1, wherein the elongate mass is joined to the piezo beam by a side flange extending from the piezo beam.

6. The electronic device of claim 1, wherein the piezo beam comprises a center metal member between outer ceramic members.

7. The electronic device of claim 1, wherein the piezo beam comprises a metal member and a single ceramic member attached to one side of the metal member.

8. The electronic device of claim 1, wherein the piezo beam has opposite ends mounted with fasteners inserted parallel to the mounting direction into the wall of the recess.

9. The electronic device of claim 1, wherein the piezo beam and elongate mass are positioned approximately parallel to a longer side of the electronic device.

10. The electronic device of claim 1, wherein the piezo beam and elongate mass are positioned adjacent a side of the electronic device.

11. The electronic device of claim 1, wherein the internal recess is sized to accommodate the piezo beam and the elongate mass in a bare condition.

12. The electronic device of claim 1, wherein the piezo beam and the elongate mass are spaced apart from the each of the first and second antenna regions.

13. The electronic device of claim 1, wherein the piezo beam is electrically linked to a driver controllable to drive the piezo beam to vibrate at the selected frequencies.

14. The electronic device of claim 13, further comprising at least one microprocessor controllably linked to the driver.

15. The electronic device of claim 13, further comprising a filter configured to filter out undesired vibrations outside of the selected frequency range.

* * * * *